United States Patent
Shiraishi et al.

(10) Patent No.: US 9,160,359 B2
(45) Date of Patent: Oct. 13, 2015

(54) ANALOG-TO-DIGITAL CONVERTER AND ANALOG-TO-DIGITAL CONVERSION METHOD

(71) Applicant: KABUSHIKI KAISHA TOSHIBA, Tokyo (JP)

(72) Inventors: Kei Shiraishi, Tokyo (JP); Junya Matsuno, Kanagawa (JP); Masanori Furuta, Kanagawa (JP); Tetsuro Itakura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/548,886

(22) Filed: Nov. 20, 2014

(65) Prior Publication Data

US 2015/0138007 A1 May 21, 2015

(30) Foreign Application Priority Data

Nov. 20, 2013 (JP) ................................. 2013-240445

(51) Int. Cl.
*H03M 1/36* (2006.01)
*H03M 1/20* (2006.01)
*H03M 1/12* (2006.01)
*H03M 1/18* (2006.01)

(52) U.S. Cl.
CPC ............. *H03M 1/20* (2013.01); *H03M 1/1245* (2013.01); *H03M 1/18* (2013.01); *H03M 1/36* (2013.01)

(58) Field of Classification Search
CPC ........... H03M 1/00; H03M 1/12; H03M 1/06; H03M 1/18; H03M 1/20; H03M 1/36; H03M 1/44; H03M 1/1245; H03M 1/1014; H03M 1/167; H03M 1/162; H03M 1/0604
USPC ................... 341/155–161; 375/258, 340, 222
See application file for complete search history.

(56) References Cited

U.S. PATENT DOCUMENTS

| | | | | |
|---|---|---|---|---|
| 5,696,511 A | * | 12/1997 | Matsumoto et al. | 341/161 |
| 5,821,893 A | * | 10/1998 | Kumamoto et al. | 341/156 |
| 6,445,330 B1 | * | 9/2002 | Thomsen et al. | 341/172 |

(Continued)

FOREIGN PATENT DOCUMENTS

| | | |
|---|---|---|
| JP | 06-204873 | 7/1994 |
| JP | 2004 304413 | 10/2004 |

OTHER PUBLICATIONS

Jae-hong Kim et al., "A 14b Extended Counting ADC Implemented in a 24MPixel APS-C CMOS Image Sensor", 2012 IEEE International Solid-State Circuits Conference, Session 22 / Image Sensors / 22.6, pp. 390-392.

(Continued)

*Primary Examiner* — Lam T Mai
(74) *Attorney, Agent, or Firm* — Finnegan, Henderson, Farabow, Garrett & Dunner, LLP

(57) ABSTRACT

According to an embodiment, an analog-to-digital (AD) converter includes a first AD conversion unit, a selector and a second AD conversion unit. The first AD conversion unit performs AD conversion of an analog signal in a first period to generate an upper-bit digital signal. The selector selects not less than one reference voltage based on the upper-bit digital signal to obtain a selected reference voltage group in a voltage range narrower than a full scale. The second AD conversion unit performs AD conversion of the analog signal by using the selected reference voltage group. The first period starts before settling of the analog signal up to an accuracy corresponding to a total resolution of the first AD conversion unit and the second AD conversion unit.

6 Claims, 9 Drawing Sheets

(56) References Cited

U.S. PATENT DOCUMENTS 7,893,859 B2 * 2/2011 Kawahito .................. 341/158
8,742,969 B2 * 6/2014 Oo et al. .................... 341/156

OTHER PUBLICATIONS

Richard Schreier et al., "Understanding Delta-Sigma Data Converters," Wiley, Oct. 2004, http://as.wiley.com/WileyCDA/WileyTitle/productCd-0471465852.html, Apr. 1, 2015, pp. 36-39.

Youngcheol Chae et al., "A 2.1Mpixel 120frame/s CMOS Image Sensor with Column-Parallel ΔΣ ADC Architecture," 2010 IEEE International Solid-State Circuits Conference, Session 22 / Image Sensors / 22.1, pp. 394-396.

Min-Woong Seo et al., "An 80μ$V_{rms}$ Temporal-Noise 82dB-Dynamic-Range CMOS Image Sensor with a 13-to-19b Variable-Resolution Column-Parallel Folding-Integration/Cyclic ADC," 2011 IEEE International Solid-State Circuits Conference, Session 23 / Image Sensors / 23.1, pp. 400-402.

* cited by examiner

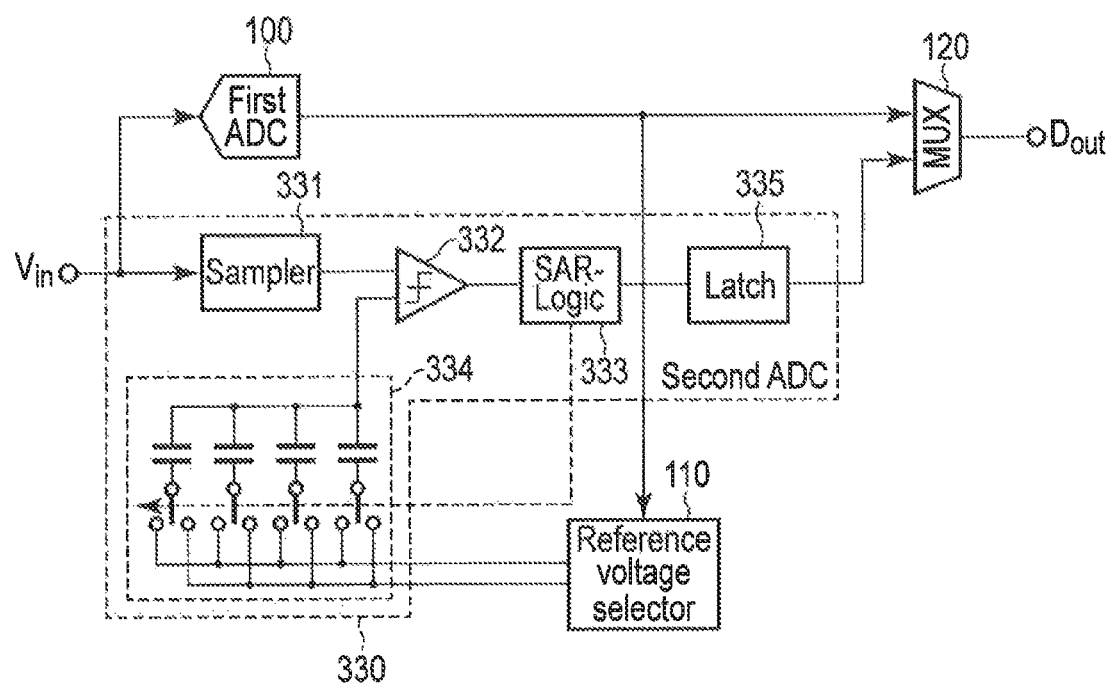
F I G. 7
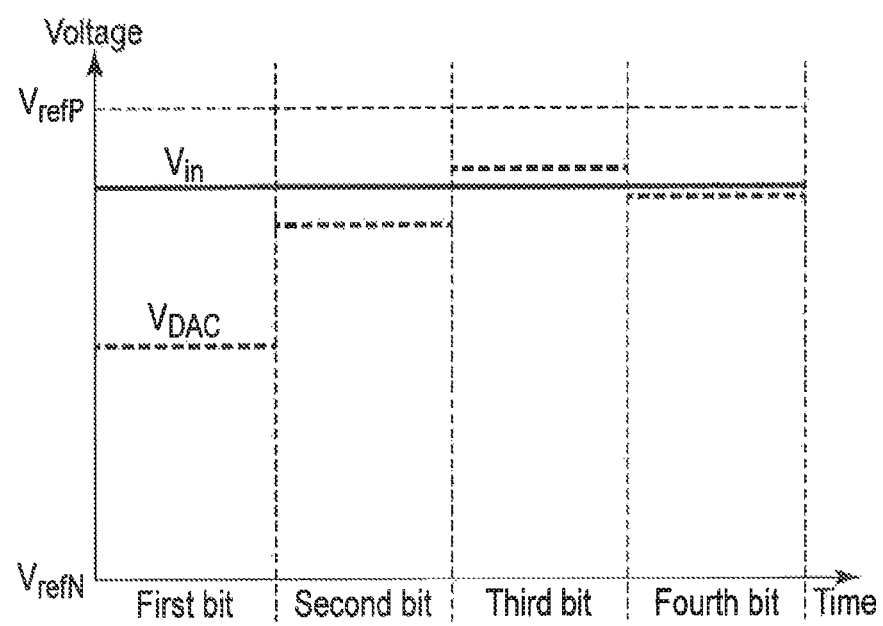
F I G. 8

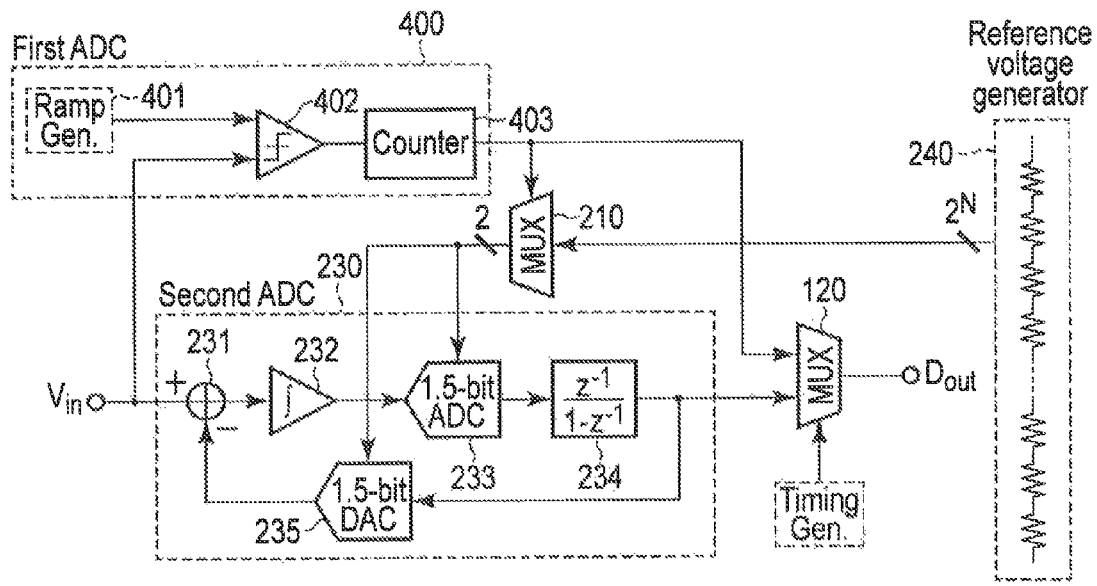
F I G. 9
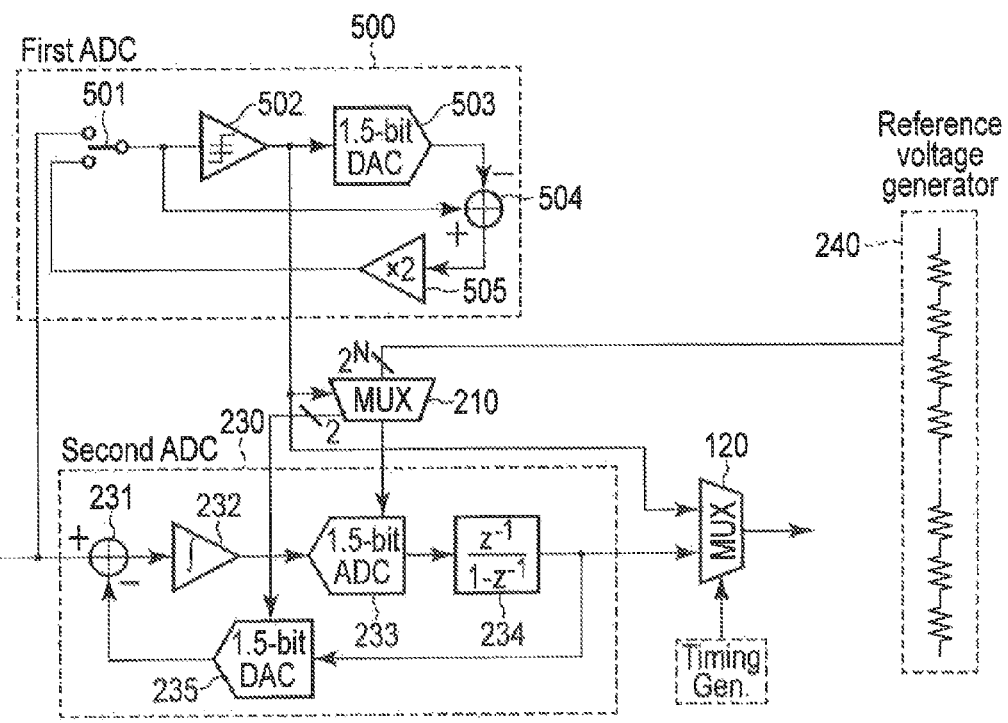
F I G. 10

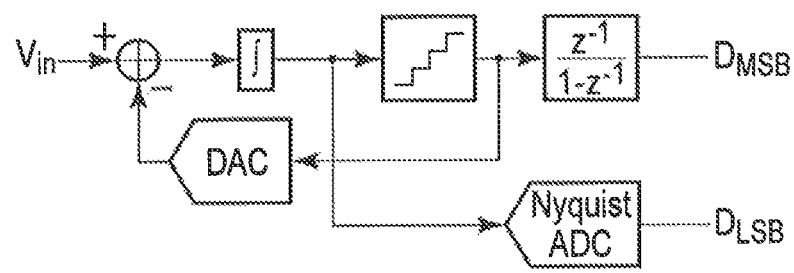
F I G. 11
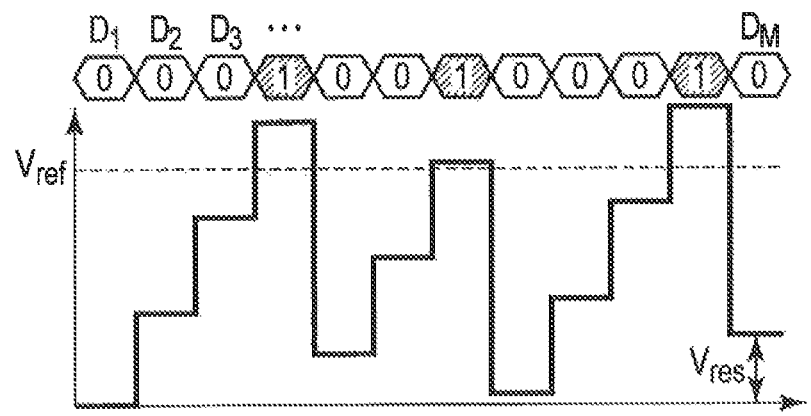
F I G. 12

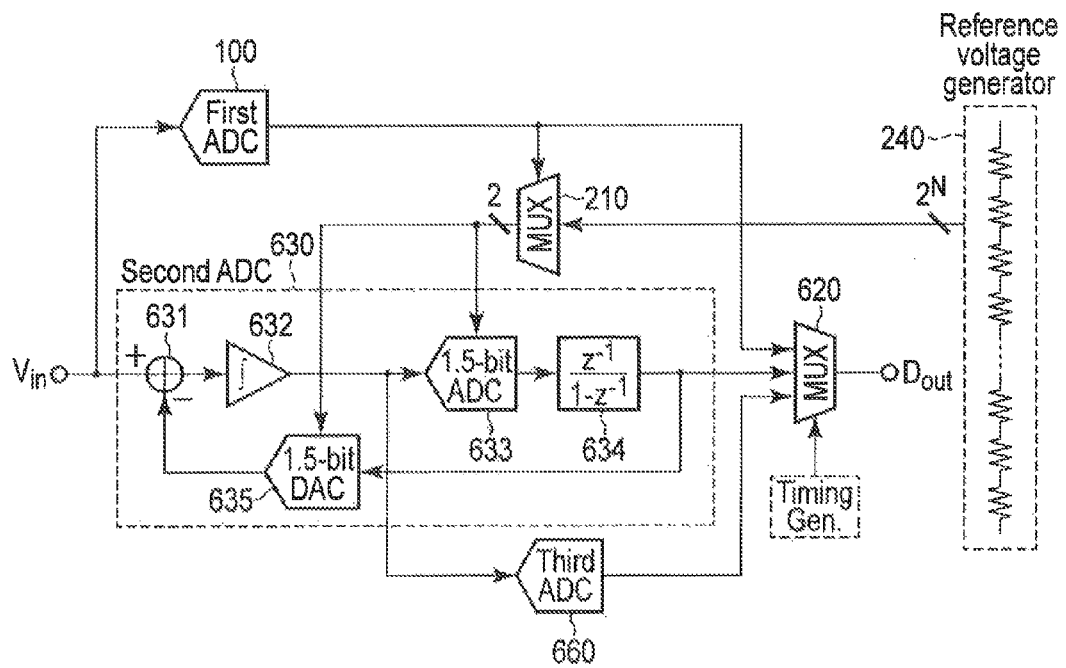
F I G. 13
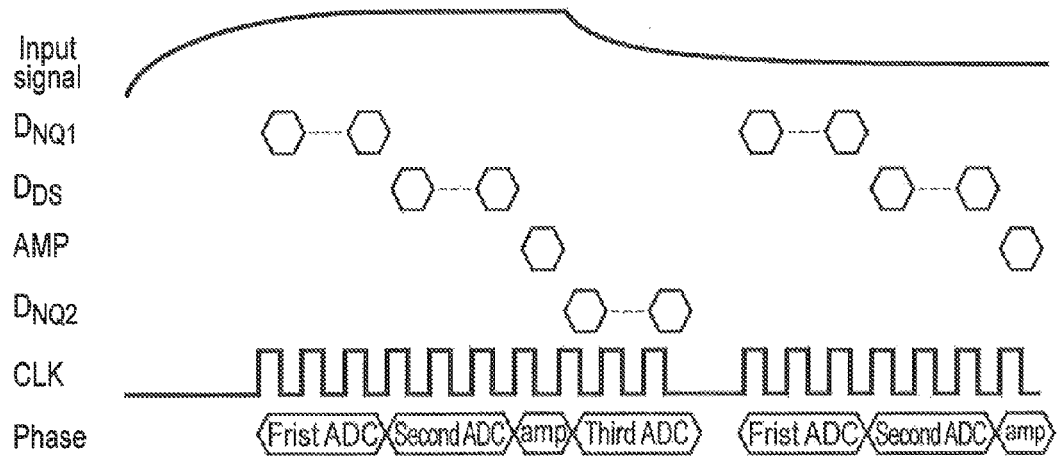
F I G. 14

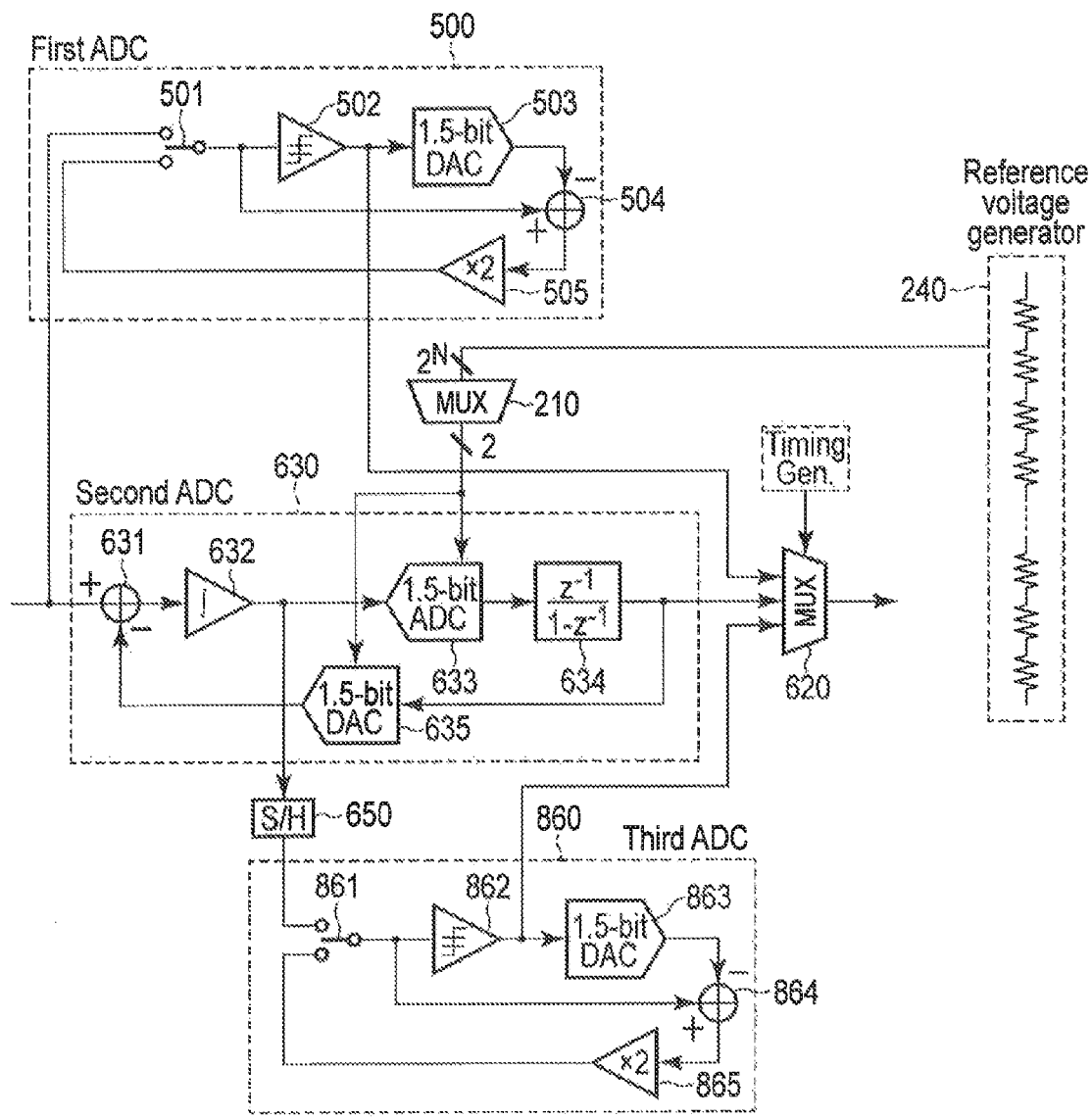
F I G. 16

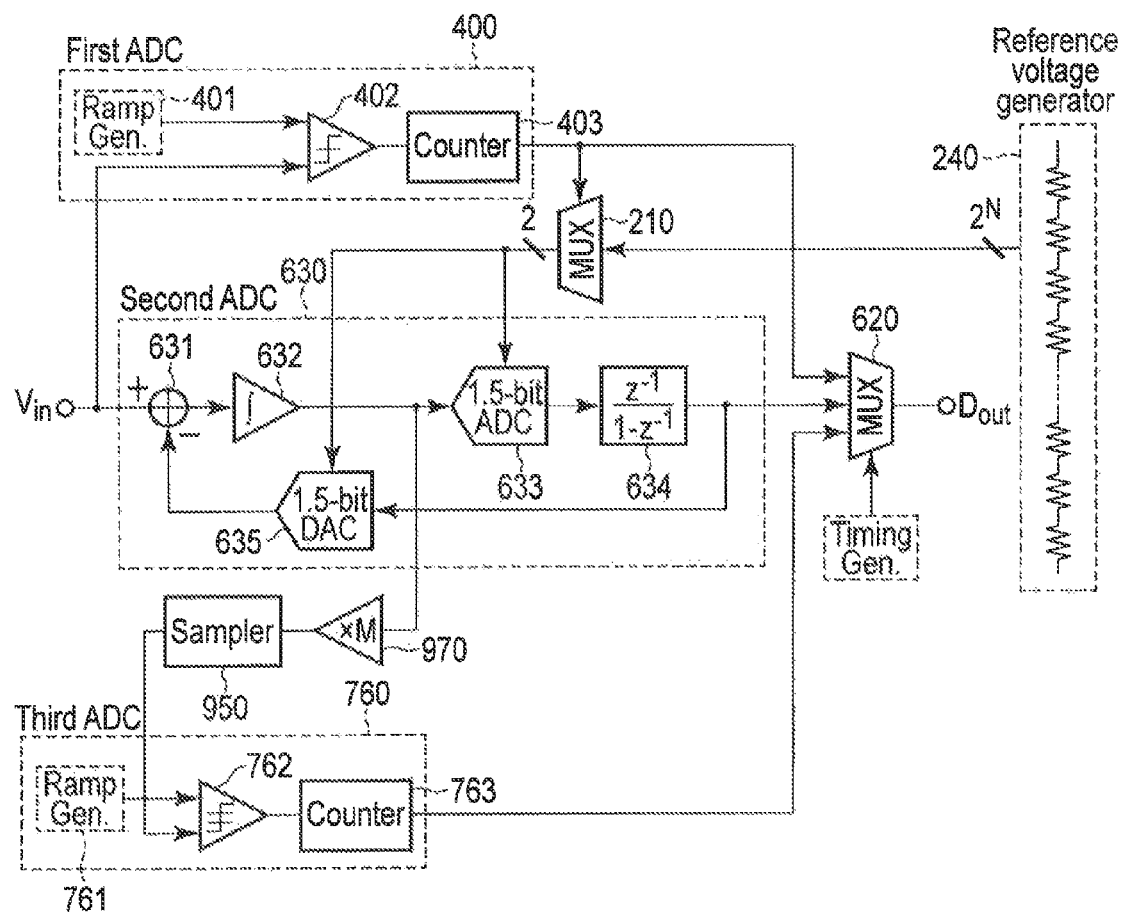
F I G. 17

ANALOG-TO-DIGITAL CONVERTER AND ANALOG-TO-DIGITAL CONVERSION METHOD

CROSS-REFERENCE TO RELATED APPLICATIONS

This application is based upon and claims the benefit of priority from Japanese Patent Application No. 2013-240445, filed Nov. 20, 2013, the entire contents of which are incorporated herein by reference.

FIELD

Embodiments described herein relate generally to an analog-to-digital converter.

BACKGROUND

In order to implement high-resolution analog-to-digital conversion with, for example, an effective resolution exceeding 14 bits, a multisampling ADC (Analog-to-Digital Converter) such as a $\Delta\Sigma$ modulator is used. A general ADC performs sampling once for one input signal. In contrast, a multisampling ADC performs sampling a plurality of times for one input signal and averages the analog-to-digital conversion results in a digital domain. Therefore, the multisampling ADC can achieve a high resolution in analog-to-digital conversion.

The number of times of sampling required for multisampling ADC, however, exponentially increases with respect to the resolution of the multisampling ADC. For example, in order to implement an effective resolution of 14 bits by singly using a $\Delta\Sigma$ modulator incorporating a 1-bit quantizer, it is necessary to perform sampling 1,000 times and 88 times in a primary modulator and a secondary modulator, respectively. An increase in the resolution of the multisampling ADC will lead to a decrease in the operating speed of the multisampling ADC. In addition, an incremental $\Delta\Sigma$ modulator as a kind of $\Delta\Sigma$ modulator incorporates an analog integrator such as a switched capacitor integrator. When performing high-resolution analog-to-digital conversion by using a full-scale reference voltage, since the voltage of an input signal to the analog integrator greatly fluctuates, a long period of time is required for the settling of the input signal.

BRIEF DESCRIPTION OF THE DRAWINGS

FIG. 7 is a block diagram exemplifying an ADC according to the third embodiment;

FIG. 8 is a chart for explaining the operation of a second analog-to-digital conversion unit in FIG. 7;

FIG. 9 is a block diagram exemplifying an ADC according to the fourth embodiment;

FIG. 10 is a block diagram exemplifying an ADC according to the fifth embodiment;

FIG. 11 is a block diagram for explaining the operation of an ADC according to the sixth embodiment;

FIG. 12 is a timing chart exemplifying the operations of an incremental $\Delta\Sigma$ modulator and Nyquist ADC in FIG. 11;

FIG. 13 is a block diagram exemplifying an ADC according to the sixth embodiment;

FIG. 14 is a timing chart exemplifying the operation of the ADC in FIG. 13;

FIG. 16 is a block diagram exemplifying an ADC according to the eighth embodiment; and FIG. 17 is a block diagram exemplifying an ADC according to the ninth embodiment.

DETAILED DESCRIPTION

Figure 1:
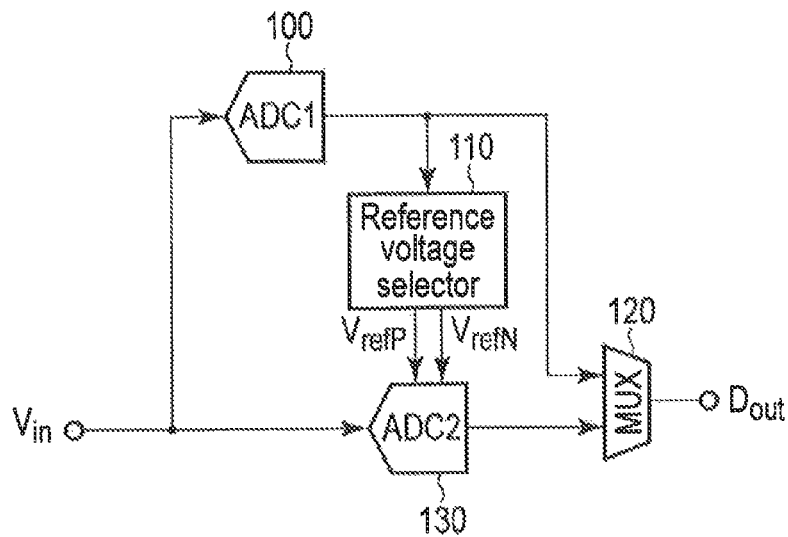
FIG. 1 is a block diagram exemplifying an ADC according to the first embodiment.

Embodiments will be described below with reference to the accompanying drawings.

According to an embodiment, an analog-to-digital converter includes a first analog-to-digital conversion unit, a selector and a second analog-to-digital conversion unit. The first analog-to-digital conversion unit performs analog-to-digital conversion of an analog signal in a first period to generate an upper-bit digital signal. The selector selects not less than one reference voltage based on the upper-bit digital signal to obtain a selected reference voltage group in a voltage range narrower than a full scale. The second analog-to-digital conversion unit performs analog-to-digital conversion of the analog signal by using the selected reference voltage group to generate a lower-bit digital signal. The first period starts before settling of the analog signal up to an accuracy corresponding to a total resolution of the first analog-to-digital conversion unit and the second analog-to-digital conversion unit.

Note that the same or similar reference numerals denote the same or similar elements to those described above, and a repetitive description of them will be basically omitted.

(First Embodiment)

As exemplified by FIG. 1, an ADC according to the first embodiment includes a first analog-to-digital conversion unit 100, a reference voltage selector 110, a multiplexer 120, and a second analog-to-digital conversion unit 130. The ADC in FIG. 1 generates a digital signal $D_{out}$ including an upper-bit digital signal and a lower-bit digital signal by performing analog-to-digital conversion of an analog signal $V_{in}$.

The first analog-to-digital conversion unit 100 receives an analog signal in the first period to be described later. The first analog-to-digital conversion unit 100 generates an upper-bit digital signal by performing analog-to-digital conversion of an analog signal in the first period. The first analog-to-digital conversion unit 100 outputs the upper-bit digital signal to the reference voltage selector 110 and the multiplexer 120.

The reference voltage selector 110 receives the upper-bit digital signal from the first analog-to-digital conversion unit 100. The reference voltage selector 110 obtains a selected reference voltage group including at least one reference voltage by selecting one or more voltages from a plurality of reference voltages based on the upper-bit digital signal. A reference voltage generator (not shown) generates the plurality of reference voltages. The voltage range between the minimum and maximum values of the reference voltages included in this selected reference voltage group is narrower than the full scale. The reference voltage selector 110 outputs the selected reference voltage group to the second analog-to-digital conversion unit 130.

For example, the reference voltage selector 110 may select two reference voltages according to the following technique. If the resolution of the first analog-to-digital conversion unit 100 is K bits, the first analog-to-digital conversion unit 100 performs analog-to-digital conversion of an analog signal by using reference voltages $V_{ref1}, V_{ref2}, \ldots, V_{refX}$ in full scale. Note that these reference voltages $V_{ref1}, V_{ref2}, \ldots V_{refX}$ are arranged in ascending order of voltage magnitude. In addition, $X=2^K$.

Assume that a digital signal with a value J is generated by analog-to-digital conversion of an analog signal. In this case, J represents a value equal to or more than 0 and equal to or less than $2^K-1$. The reference voltage selector 110 selects a reference voltage $V_{ref(J-1)}$ lower than a reference voltage $V_{ref}$ corresponding to the digital signal J by one step, and a reference voltage $V_{ref(J+1)}$ higher than the reference voltage $V_{refJ}$ by one step. As a result, the second analog-to-digital conversion unit 130 uses $V_{ref(J+1)}$ as a maximum reference voltage $V_{refP}$, and $V_{ref(J-1)}$ as a minimum reference voltage $V_{refN}$. At this time, the voltage range of the reference voltages used by the second analog-to-digital conversion unit 130 is $2/(2^K-1)$ times the full scale. Note that in general, the reference voltage selector 110 can select a reference voltage $V_{ref(J-a)}$ lower than the reference voltage $V_{refJ}$ corresponding to the above digital signal by a steps, and a reference voltage $V_{ref(J+b)}$ higher than the reference voltage $V_{refJ}$ by b steps. In this case, a and b are integers, which may be the same or different.

The second analog-to-digital conversion unit 130 may be implemented by, for example, an incremental ΔΣ modulator, a SAR (Successive Approximation Register) ADC, and the like. The second analog-to-digital conversion unit 130 receives an analog signal in the second period to be described later. The second analog-to-digital conversion unit 130 receives a selected reference voltage group from the reference voltage selector 110. This selected reference voltage group is adaptively decided based on the upper-bit digital signal. The second analog-to-digital conversion unit 130 generates a lower-bit digital signal by performing analog-to-digital conversion of an analog signal using the selected reference voltage group in the second period. The second analog-to-digital conversion unit 130 outputs the lower-bit digital signal to the multiplexer 120.

The multiplexer 120 receives the upper-bit digital signal from the first analog-to-digital conversion unit 100, and the lower-bit digital signal from the second analog-to-digital conversion unit 130. The multiplexer 120 generates a digital signal by multiplexing the upper-bit digital signal and the lower-bit digital signal.

As described above, the first analog-to-digital conversion unit 100 performs analog-to-digital conversion of an analog signal in the first period. Assume that the first period starts before the complete settling of the analog signal. Assume that the complete settling of an analog signal means the settling of the analog signal with an accuracy of $V_{FS}/2^{K+L}$. $V_{FS}$ represents a reference voltage in full scale, and L represents the resolution of the second analog-to-digital conversion unit 130. That is, the complete settling of an analog signal means the settling of the analog signal with the overall resolution of the ADC in FIG. 1 (that is, the total resolution of the first analog-to-digital conversion unit 100 and the second analog-to-digital conversion unit 130).

That is, the first period can start before the settling of an analog signal with an accuracy of $V_{FS}/2^{K+L}$ and after the settling of the analog signal with an accuracy of $V_{FS}/2^K$ (that is an accuracy corresponding to the resolution of the first analog-to-digital conversion unit 100). On the other hand, the second period starts after the complete settling of an analog signal (that is, the settling of the analog signal with an accuracy of $V_{FS}/2^{K+L}$).

Note that every time a resolution K of the first analog-to-digital conversion unit 100 increases by 1 bit, the overall quantization noise decreases by 6 dB. Therefore, increasing the resolution of the first analog-to-digital conversion unit 100 can decrease the number of times of sampling required for the second analog-to-digital conversion unit 130.

As described above, the second analog-to-digital conversion unit 130 uses a selected reference voltage group in a voltage range narrower than the full scale. For this reason, even if the second analog-to-digital conversion unit 130 incorporates, for example, an analog integrator, since the voltage of an input signal to the analog integrator does not greatly fluctuate, a long period of time is not required for the settling of the input signal.

Figure 2:
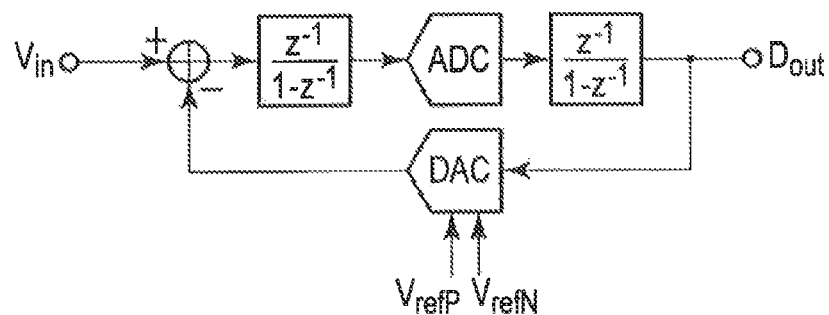
FIG. 2 is a block diagram exemplifying an incremental $\Delta\Sigma$ modulator according to a comparative example.

Consider the incremental ΔΣ modulator exemplified by FIG. 2 as a comparative example of the ADC in FIG. 1. The incremental ΔΣ modulator in FIG. 2 includes a subtractor, an analog integrator, an ADC, a digital integrator, and a DAD (Digital-to-Analog Converter). The incremental ΔΣ modulator in FIG. 2 generates a digital signal $D_{out}$ by performing analog-to-digital conversion of an analog signal $V_{in}$.

The subtractor receives an analog signal, and a feedback signal from the DAC. The subtractor generates a difference signal by subtracting the feedback signal from the analog signal. The subtractor outputs the difference signal to the analog integrator.

The analog integrator receives the difference signal from the subtractor. The analog integrator generates an integral signal by integrating the difference signal. The analog integrator outputs the integral signal to the ADC.

The ADC receives the integral signal from the analog integrator. The ADC generates a digital signal by performing analog-to-digital conversion of the integral signal by using a full-scale reference voltage. The ADC outputs the digital signal to the digital integrator and the DAC.

The digital integrator receives the digital signal from the ADC. The digital integrator generates an integral signal by integrating the digital signal. Upon completion of analog-to-digital conversion by the incremental ΔΣ modulator in FIG. 2, the digital integrator outputs the integral signal as a digital signal.

The DAC receives the digital signal from the ADC. The DAC generates a feedback signal in the next cycle by performing digital-to-analog conversion of the digital signal by using the full-scale reference voltage. The DAC outputs the feedback signal to the subtractor.

Figure 3:
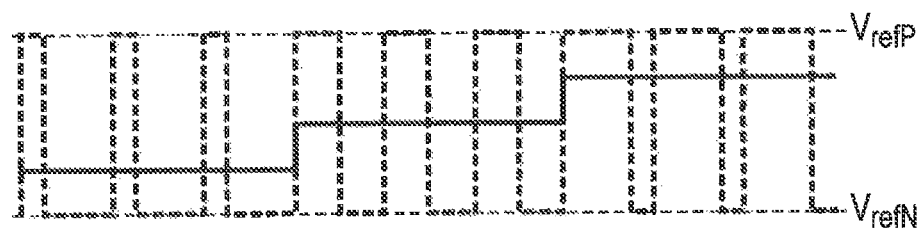
FIG. 3 is a chart exemplifying an analog signal and a feedback signal in the $\Delta\Sigma$ modulator in FIG. 2.

The analog signal $V_{in}$ and the feedback signal in the incremental ΔΣ modulator in FIG. 2 change as exemplified by FIG. 3. Referring to FIG. 3, the solid line represents the analog signal, and the dotted line represents the feedback signal.

The voltage waveform of the feedback signal has a pulse-like shape. If the analog signal is a DC (Direct Current), the average value of the voltage of the feedback signal coincides with the voltage of the analog signal. The amplitude of this feedback signal depends on the voltage range of reference voltages used by the DAC. In addition, since the above difference signal is generated based on the feedback signal, the voltage of an input signal in the analog integrator fluctuates more with an increase in the voltage range of reference voltages used by the DAC. That is, as the voltage range of reference voltages used by the DAC becomes wider, a longer time is required for the settling of an input signal in the analog integrator. When the DAC uses a full-scale reference voltage, the longest time is required for the settling of an input signal in the analog integrator.

Figure 4:
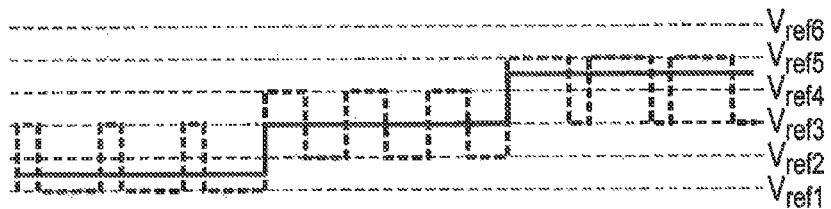
FIG. 4 is a chart exemplifying an analog signal and a feedback signal in a second analog-to-digital conversion unit in FIG. 1.

Assume that the second analog-to-digital conversion unit 130 in FIG. 1 is an incremental ΔΣ modulator identical or similar to that shown in FIG. 2. In this case, the analog signal $V_{in}$ and the feedback, signal in the second analog-to-digital conversion unit 130 change as exemplified by FIG. 4. Referring to FIG. 4, the solid line represents the analog signal, and the dotted line represents the feedback signal. As described above, the second analog-to-digital conversion unit 130 uses a selected reference voltage group in a voltage range narrower than the full scale. Therefore, the time required for the settling of an input signal in the analog integrator becomes shorter than that in the case of FIG. 3. That is, using a proper selected reference voltage group can increase the operating frequency of the second analog-to-digital conversion unit 130 without degrading the accuracy of analog-to-digital conversion, and hence implement high-speed analog-to-digital conversion.

Figure 5:
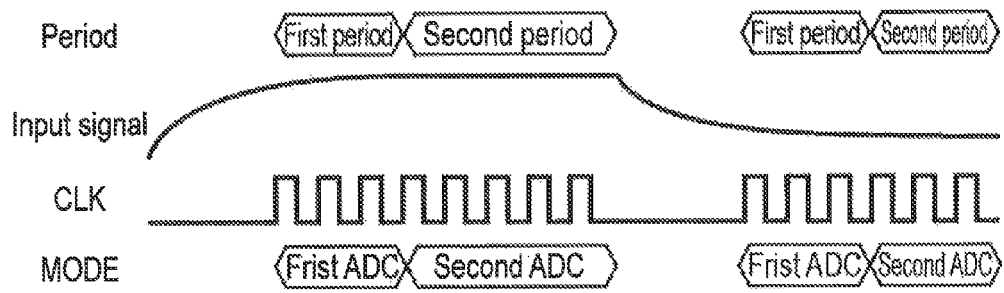
FIG. 5 is a timing chart exemplifying the operation of the ADC in FIG. 1.

For generalization, the ADC in FIG. 1 operates as exemplified by FIG. 5. That is, before the complete settling of the analog signal $V_{in}$, the first analog-to-digital conversion unit 100 performs analog-to-digital conversion of the analog input signal (first period). In addition, the reference voltage selector 110 obtains a selected reference voltage group by selecting a reference voltage based on the digital signal generated by the first analog-to-digital conversion unit 100. After the complete settling of an analog input signal, the second analog-to-digital conversion unit 130 performs analog-to-digital conversion of the analog input signal by using the selected reference voltage group at high speed (second period).

As described above, the ADC according to the first embodiment includes a first analog-to-digital conversion unit for upper bits and the second analog-to-digital conversion unit for lower bits. Before the complete settling of an analog signal, the first analog-to-digital conversion unit generates an upper-bit digital signal by roughly performing analog-to-digital conversion of the analog signal. Then, a selected reference voltage group in a voltage range narrower than the full scale is obtained based on this upper-bit digital signal. This selected reference voltage group can increase the operating frequency which can be used by the second analog-to-digital conversion unit. After the complete settling of an analog signal, the second analog-to-digital conversion unit generates a lower-bit digital signal by finely performing analog-to-digital conversion of the analog signal by using the above selected reference voltage group. Therefore, this ADC can perform analog-to-digital conversion at high speed.

(Second Embodiment)

Figure 6:
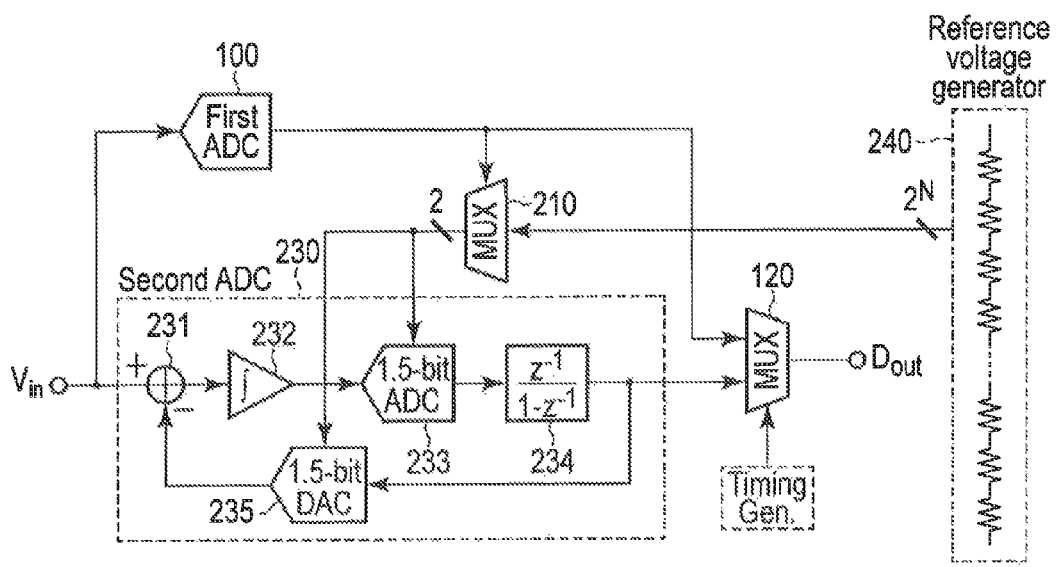
FIG. 6 is a block diagram exemplifying an ADC according to the second embodiment.

As exemplified by FIG. 6, an ADC according to the second embodiment includes a first analog-to-digital conversion unit 100, a multiplexer 210, a multiplexer 120, a second analog-to-digital conversion unit 230, and a reference voltage generator 240. The ADC in FIG. 6 generates a digital signal $D_{out}$ including an upper-bit digital signal and a lower-bit digital signal by performing analog-to-digital conversion of an analog signal $V_{in}$.

The first analog-to-digital conversion unit 100 in FIG. 6 differs from the first analog-to-digital conversion unit 100 in FIG. 1 in that it outputs an upper-bit digital signal to the multiplexer 210 instead of the reference voltage selector 110. The multiplexer 120 in FIG. 6 differs from the multiplexer 120 in FIG. 1 in that it receives a lower-bit digital signal from the second analog-to-digital conversion unit 230 instead of the second analog-to-digital conversion unit 130.

The multiplexer 210 receives an upper-bit digital signal from the first analog-to-digital conversion unit 100. The multiplexer 210 obtains a selected reference voltage group including at least one reference voltage by selecting one or more voltages from a plurality of reference voltages based on the upper-bit digital signal. The reference voltage generator 240 generates the plurality of reference voltages. The voltage range from the minimum and maximum values of this selected reference voltage group is narrower than the full scale. The multiplexer 210 outputs the selected reference voltage group to the second analog-to-digital conversion unit 230. The multiplexer 210 may perform the same or similar processing to that performed by the reference voltage selector 110.

The second analog-to-digital conversion unit 230 corresponds to an incremental ΔΣ modulator. The second analog-to-digital conversion unit 230 receives the analog signal in the second period described above. The second analog-to-digital conversion unit 230 also receives a selected reference voltage group from the multiplexer 210. This selected reference voltage group is adaptively decided based on the upper-bit digital signal. The second analog-to-digital conversion unit 230 generates a lower-bit digital signal by performing analog-to-digital conversion of the analog signal by using the selected reference voltage group in the second period. The second analog-to-digital conversion unit 230 outputs the lower-bit digital signal to the multiplexer 120.

More specifically, the second analog-to-digital conversion unit 230 includes a subtractor 231, an analog integrator 232, an ADC 233, a digital integrator 234, and a DAC 235.

The subtractor 231 receives an analog signal, and a feedback signal from the DAC 235. The subtractor 231 generates a difference signal by subtracting the feedback signal from the analog signal. The subtractor 231 outputs the difference signal to the analog integrator 232.

The analog integrator 232 receives the difference signal from the subtractor 231. The analog integrator 232 generates an integral signal by integrating the difference signal. The analog integrator 232 outputs the integral signal to the ADC 233.

The ADC 233 receives a selected reference voltage group from the multiplexer 210, and the integral signal from the analog integrator 232. The ADC 233 generates a digital signal by performing analog-to-digital conversion of the integral signal by using the selected reference voltage group. The ADC 233 outputs the digital signal to the digital integrator 234 and the DAC 235. Note that the ADC 233 may be referred to as the internal ADC 233 to be discriminated from the ADC in FIG. 6.

The digital integrator 234 receives the digital signal from the ADC 233. The digital integrator 234 generates an integral signal by integrating the digital signal. The digital integrator 234 outputs the integral signal as an upper-bit digital signal to the multiplexer 120 upon completion of analog-to-digital conversion by the second analog-to-digital conversion unit 230.

The DAC 235 receives the selected reference voltage group from the multiplexer 210, and the digital signal from the ADC 233. The DAC 235 generates a feedback signal in the next cycle by performing digital-to-analog conversion of the digital signal by using the selected reference voltage group. The DAC 235 outputs the feedback signal to the subtractor 231. As the voltage range of a selected reference voltage group used by the DAC 235 becomes narrower, the time required for the settling of an input signal in the analog integrator 232 becomes shorter. That is, using a proper selected reference voltage group can increase the operating frequency of the second analog-to-digital conversion unit 230, and hence implement high-speed analog-to-digital conversion.

The reference voltage generator 240 corresponds to, for example, a resistor ladder circuit. The reference voltage generator 240 generates a plurality of reference voltages by, for example, dividing the voltage applied from a voltage source (not shown).

As described above, the ADC according to the second embodiment uses an incremental ΔΣ modulator as the second analog-to-digital conversion unit described in the first embodiment. Therefore, this ADC can obtain the same or similar effects to those of the first embodiment.

(Third Embodiment)

As exemplified by FIG. 7, an ADC according to the third embodiment includes a first analog-to-digital conversion unit 100, a reference voltage selector 110, a multiplexer 120, and a second analog-to-digital conversion unit 330. The ADC in FIG. 7 generates a digital signal $D_{out}$ including an upper-bit digital signal and a lower-bit digital signal by performing analog-to-digital conversion of an analog signal $V_{in}$.

The reference voltage selector 110 in FIG. 7 differs from the reference voltage selector 110 in FIG. 1 in that it outputs a selected reference voltage group to the second analog-to-digital conversion unit 330 instead of the second analog-to-digital conversion unit 130. The multiplexer 120 in FIG. 7 differs from the multiplexer 120 in FIG. 1 in that it receives a lower-bit digital signal from the second analog-to-digital conversion unit 330 instead of the second analog-to-digital conversion unit 130.

The second analog-to-digital conversion unit 330 corresponds to a SAR ADC. The second analog-to-digital conversion unit 330 receives an analog signal in the second period described above. In addition, the second analog-to-digital conversion unit 330 receives a selected reference voltage group from the reference voltage selector 110. This selected reference voltage group is adaptively decided based on an upper-bit digital signal. The second analog-to-digital conversion unit 330 generates a lower-bit digital signal by performing analog-to-digital conversion of the analog signal by using the selected reference voltage group in the second period. The second analog-to-digital conversion unit 330 outputs the lower-bit digital signal to the multiplexer 120.

More specifically, the second analog-to-digital conversion unit 330 includes a sampler 331, a comparator 332, a SAR logic circuit 333, a DAC 334, and a latch register 335.

The sampler 331 receives an analog signal. The sampler 331 obtains a sampled signal by sampling the analog signal. The sampler 331 outputs the sampled signal to the first input terminal of the comparator 332.

The comparator 332 includes first and second input terminals. The comparator 332 receives the sampled signal from the sampler 331 via the first input terminal, and a feedback signal from the DAC 334 via the second input terminal. The comparator 332 outputs the comparison result signal obtained from the sampled signal and the feedback signal to the SAR logic circuit 333. For example, the connector 322 may output a comparison result signal of "1" if the voltage of the sampled signal is equal to or more than that of the feedback signal, and a comparison result signal of "0" otherwise.

The SAR logic circuit 333 searches for a digital signal (i.e., a lower-bit digital signal) corresponding to the sampled signal based on a binary search algorithm, as exemplified by FIG. 8. More specifically, the SAR logic circuit 333 outputs a temporary signal stored in the latch register 335 to the DAC 334. The initial value of the temporary signal is 10 . . . 0 (i.e., an intermediate scale). The SAR logic circuit 333 then receives the comparison result signal obtained from the sampled signal $V_{in}$ and a feedback signal $V_{DAC}$ corresponding to the temporary signal to the comparator 332. The SAR logic circuit 333 updates the temporary signal by replacing a target bit of the temporary signal stored in the latch register 335 with the value of the comparison result signal. In addition, the SAR logic circuit 333 temporarily sets "1" at the next target bit of the temporary signal stored in the latch register 335. The target bit sequentially moves from the MSB (Most Significant Bit) to the LSB (Least Significant Bit). After the updating of the LSD, the latch register 335 outputs the lower-bit digital signal as a temporary signal to the multiplexer 120.

The DAC 334 receives a selected reference voltage group from the reference voltage selector 110, and a temporary signal from the SAR logic circuit 333. The DAC 334 generates a feedback signal by performing digital-to-analog conversion of the temporary signal by using the selected reference voltage group. The DAC 334 outputs the feedback signal to the second input terminal of the comparator 332.

As the voltage range of a selected reference voltage group used by the DAC 334 becomes narrower, the time required for the settling of an input signal at the second input terminal of the comparator 332 becomes shorter. That is, using a proper selected reference voltage group can increase the operating frequency of the second analog-to-digital conversion unit 330, and hence implement high-speed analog-to-digital conversion.

As described above, the ADC according to the third embodiment uses a SAR ADC as the second analog-to-digital conversion unit described in the first embodiment described above. Therefore, this ADC can obtain the same or similar effects to those of the first embodiment.

(Fourth Embodiment)

As exemplified by FIG. 9, an ADC according to the fourth embodiment includes a first analog-to-digital conversion unit 400, a multiplexer 210, a multiplexer 120, a second analog-to-digital conversion unit 230, and a reference voltage generator 240. The ADC in FIG. 9 generates a digital signal $D_{out}$ including an upper-bit digital signal and a lower-bit digital signal by performing analog-to-digital conversion of an analog signal $V_{in}$.

The multiplexer 210 in FIG. 9 differs from the multiplexer 210 in FIG. 6 in that it receives the upper-bit digital signal from the first analog-to-digital conversion unit 400 instead of the first analog-to-digital conversion unit 100. The multiplexer 120 in FIG. 9 differs from the multiplexer 120 in FIG. 6 in that it receives the upper-bit digital signal from the first analog-to-digital conversion unit 400 instead of the first analog-to-digital conversion unit 100.

The first analog-to-digital conversion unit 400 corresponds to a single-slope ADC. The single-slope ADC can be implemented with a smaller area than those for other types of ADCs. In addition, the single-slope ADC consumes less power than other types of ADCs since it does not require an amplifier.

The first analog-to-digital conversion unit 400 receives an analog signal in the first period described above. The first analog-to-digital conversion unit 400 generates an upper-bit digital signal by performing analog-to-digital conversion of the analog signal in the first period. The first analog-to-digital conversion unit 400 outputs the upper-bit digital signal to the multiplexer 210 and the multiplexer 120.

More specifically, the first analog-to-digital conversion unit 400 includes a ramp wave generator 401, a comparator 402, and a counter 403.

The ramp wave generator 401 generates a ramp wave over an operation period (i.e., the first period) of the first analog-to-digital conversion unit 400. The ramp wave generator 401 outputs the ramp wave to the first input terminal of the comparator 402.

The comparator 402 includes first and second input terminals. The comparator 402 receives a ramp wave from the ramp wave generator 401 via the first input terminal, and an analog signal via the second input terminal. The comparator 402 outputs the comparison result signal obtained from the ramp wave and the analog signal in synchronism with a clock signal (not shown) to the counter 403. For example, the comparator 402 may output a comparison result signal of "1" if the voltage of the analog signal is equal to or more than that of the ramp wave, and a comparison result signal of "0" otherwise.

The counter 403 receives the comparison result signal from the comparator 402. The counter 403 counts the comparison result signal. The time (the number of clocks) taken to invert the comparison result signal (i.e., to raise the voltage of the ramp wave to a voltage higher than that of the analog signal) is proportional to the voltage of the analog signal. Therefore, the count value of the comparison result signal corresponds to the analog-to-digital conversion result of the analog signal. The counter 403 outputs the count value as an upper-bit digital signal to the multiplexer 120.

As described above, the ADC according to the fourth embodiment uses a single-slope ADC as the first analog-to-digital conversion unit described in the second embodiment described above. Therefore, this ADC can obtain the same or similar effects to those of the second embodiment. In addition, it is possible to implement the first analog-to-digital conversion unit with a small area and low power consumption.

(Fifth Embodiment)

As exemplified by FIG. 10, the ADC according to the fifth embodiment includes a first analog-to-digital conversion unit 500, a multiplexer 210, a multiplexer 120, a second analog-to-digital conversion unit 230, and a reference voltage generator 240. The ADC in FIG. 10 generates a digital signal including an upper-bit digital signal and a lower-bit digital signal by performing analog-to-digital conversion of an analog signal.

The multiplexer 210 in FIG. 10 differs from the multiplexer 210 in FIG. 6 in that it receives the upper-bit digital signal from the first analog-to-digital conversion unit 500 instead of the first analog-to-digital conversion unit 100. The multiplexer 120 in FIG. 10 differs from the multiplexer 120 in FIG. 6 in that it receives the upper-bit digital signal from the first analog-to-digital conversion unit 500 instead of the first analog-to-digital conversion unit 100.

The first analog-to-digital conversion unit 500 corresponds to a cyclic ADC. The cyclic. ADC can perform analog-to-digital conversion at high speed. More specifically, the cyclic ADC performs analog-to-digital conversion with a resolution of N bits in N cycles. In addition, since the cyclic ADC performs analog-to-digital conversion with a resolution of N bits by repeatedly operating a unit circuit over N cycles, even an increase in resolution hardly increases the mounting area.

The first analog-to-digital conversion unit 500 receives an analog signal in the first period described above. The first analog-to-digital conversion unit 500 generates an upper-bit digital signal by performing analog-to-digital conversion of the analog signal in the first period. The first analog-to-digital conversion unit 500 outputs the upper-bit digital signal to the multiplexer 210 and the multiplexer 120.

More specifically, the first analog-to-digital conversion unit 500 includes a selector 501, an ADC 502, a DAC 503, a subtractor 504, and an amplifier 505.

The selector 501 includes first and second input terminals. The selector 501 receives an analog signal via the first input terminal, and a feedback signal from the amplifier 505 via the second input terminal. The selector 501 obtains a selection signal by selecting one of these two input signals. More specifically, the selector 501 selects the analog signal in the first cycle, and the feedback signal in the second or subsequent cycle. The selector 501 outputs the selection signal to the ADC 502. If the first analog-to-digital conversion unit 500 also operates in the next cycle, the selector 501 also needs to output the selection signal to the subtractor 504.

The ADC 502 receives the selection signal from the selector 501. The ADC 502 generates a digital signal by performing analog-to-digital conversion of the selection signal. The ADC 502 outputs the digital signal to the multiplexer 120. This digital signal corresponds to a 1-bit digital signal of the upper-bit digital signal. If the first analog-to-digital conversion unit 500 also operates in the next cycle, the ADC 502 also needs to output the digital signal to the DAC 503. Note that the ADC 502 may be referred to as the internal ADC 502 to be discriminated from the ADC in FIG. 10.

The DAC 503 receives the digital signal from the ADC 502. The DAC 503 generates an analog signal by performing digital-to-analog conversion of the digital signal. The DAC 503 outputs the analog signal to the subtractor 504.

The subtractor 504 receives the selection signal from the selector 501, and the analog signal from the DAC 503. The subtractor 504 generates a residual signal corresponding to an analog-to-digital conversion residue in the ADC 502 by subtracting the analog signal from the selection signal. The subtractor 504 outputs the residual signal to the amplifier 505.

The amplifier 505 receives the residual signal from the subtractor 504. The amplifier 505 generates a feedback signal by amplifying the residual signal twice. The amplifier 505 outputs the feedback signal to the second input terminal of the selector 501.

That is, the first analog-to-digital conversion unit 500 generates an MSB digital signal of the upper-bit digital signal by comparing the voltage of the analog signal with a reference voltage in the first cycle. In addition, the first analog-to-digital conversion unit 500 generates an SSB (Second Significant Bit) digital signal of the upper-bit digital signal by comparing the above reference voltage with the voltage obtained by doubling the voltage of the residual signal, generated in the first cycle, in the second cycle. Likewise, in the Nth cycle, the first analog-to-digital conversion unit 500 generates an LSB digital signal of the upper-bit digital signal by comparing the above reference voltage with the voltage obtained by doubling the residual signal generated in the (N−1)th cycle.

Note that the ADC 502 includes the same or similar elements to those of the ADC 233, depending on the implementation. The ADC 502 and the ADC 233 can be shared by time division. The same applies to the DAC 503 and the DAC 235. In addition, the amplifier 505 also includes the same or similar elements to those of an analog integrator 232, depending on the implementation. Therefore, both the amplifier 505 and the analog integrator 232 can be shared by time division. It is possible to suppress the area of the ADC in FIG. 10 by time-divisionally sharing many elements between the first analog-to-digital conversion unit 500 and the second analog-to-digital conversion unit 230.

As described above, the ADC according to the fifth embodiment uses a cyclic ADC as the first analog-to-digital conversion unit described in the second embodiment described above. Therefore, this ADC can obtain the same or similar effects to those of the second embodiment. In addition, it is possible to implement the first analog-to-digital conversion unit with a small area and make it operate at high speed.

(Sixth Embodiment)

As exemplified by FIG. 11, it is possible to perform high-resolution analog-to-digital conversion at high speed by combining an incremental ΔΣ modulator for upper bits and a Nyquist ADC for lower bits. More specifically, the incremental ΔΣ modulator generates an upper-bit digital signal $D_{MSB}$ by performing analog-to-digital conversion of an analog signal $V_{in}$. The Nyguist ADC then generates a lower-bit digital signal $D_{LSB}$ by performing analog-to-digital conversion of a residual signal corresponding to an analog-to-digital conversion residue in the above incremental ΔΣ modulator.

More specifically, the incremental ΔΣ modulator in FIG. 11 operates as exemplified by FIG. 12. In the case in FIG. 12, an analog signal is sampled M times (M is an integer equal to or more than 2). Referring to FIG. 12, the internal ADC of the incremental ΔΣ modulator generates digital signals $D_1, \ldots, D_M$ through the first to Mth samplings. The integration result (i.e., the total sum) of the digital signals $D_1, \ldots, D_M$ is output as the upper-bit digital signal $D_{MSB}$. Referring to FIG. 12, the polygonal line represents a change in the voltage of an integral signal held by the internal analog integrator of the incremental ΔΣ modulator. The internal ADC and DAC of the incremental ΔΣ modulator use a reference voltage $V_{ref}$. The above residual signal has a voltage $V_{res}$.

As shown in FIG. 12, if a digital signal is "1" (in other words, an integral signal exceeds $V_{ref}$), since the voltage $V_{ref}$ of a feedback signal corresponding to the digital signal is higher than that of an analog signal, a difference signal having a negative voltage is generated based on the feedback signal. That is, the voltage of the integral signal held by the analog integrator decreases. According to feedback control, it is possible to make the voltage of an input signal in the internal ADC fall within a predetermined range.

According to the case of FIG. 12, the following equation holds between the analog signal $V_{in}$, the sampling count M, the reference voltage $V_{ref}$, the digital signals $D_1, \ldots, D_M$, and the residual signal $V_{res}$.

$$MV_{in} = V_{ref}\sum_{i=1}^{M} D_i + V_{res}$$

The ADC according to the sixth embodiment can improve a resolution while suppressing a decrease in operating speed by using components exemplified by FIG. 11 as the second analog-to-digital conversion unit for intermediate bits and the third analog-to-digital conversion unit for lower bits.

As exemplified by FIG. 13, the ADC according to this embodiment includes a first analog-to-digital conversion unit 100, a multiplexer 210, a multiplexer 620, a second analog-to-digital conversion unit 630, a reference voltage generator 240, and a third analog-to-digital conversion unit 660. The ADC in FIG. 13 generates a digital signal $D_{out}$ including an upper-bit digital signal, an intermediate-bit digital signal, and a lower-bit digital signal by performing analog-to-digital conversion of an analog signal $V_{in}$.

The first analog-to-digital conversion unit 100 in FIG. 13 differs from the first analog-to-digital conversion unit 100 in FIG. 6 in that it outputs the upper-bit digital signal to the multiplexer 620 instead of the multiplexer 120. The multiplexer 210 in FIG. 13 differs from the multiplexer 210 in FIG. 6 in that it outputs a selected reference voltage group to the second analog-to-digital conversion unit 630 instead of the second analog-to-digital conversion unit 230.

The multiplexer 620 receives the upper-bit digital signal from the first analog-to-digital conversion unit 100, the intermediate-bit digital signal from the second analog-to-digital conversion unit 630, and the lower-bit digital signal from the third analog-to-digital conversion unit 660. The multiplexer 620 generates a digital signal by multiplexing the upper-bit digital signal, the intermediate-bit digital signal, and the lower-bit digital signal.

The second analog-to-digital conversion unit 630 corresponds to an incremental ΔΣ modulator. The second analog-to-digital conversion unit 630 receives an analog signal in the second period described above. The second analog-to-digital conversion unit 630 also receives a selected reference voltage group from the multiplexer 210. This selected reference voltage group is adaptively decided based on the upper-bit digital signal. The second analog-to-digital conversion unit 630 generates an intermediate-bit digital signal by performing analog-to-digital conversion of the analog signal by using the selected reference voltage group in the second period. The second analog-to-digital conversion unit 630 outputs the intermediate-bit digital signal to the multiplexer 620. In addition, the second analog-to-digital conversion unit 630 outputs a residual signal corresponding to an analog-to-digital conversion residue in the second analog-to-digital conversion unit 630 to the third analog-to-digital conversion unit 660.

More specifically, the second analog-to-digital conversion unit 630 includes a subtractor 631, an analog integrator 632, an ADC 633, a digital integrator 634, and a DAC 635.

The subtractor 631 receives an analog signal, and a feedback signal from the DAC 635. The subtractor 631 generates a difference signal by subtracting the feedback signal from the analog signal. The subtractor 631 outputs the difference signal to the analog integrator 632.

The analog integrator 632 receives the difference signal from the subtractor 631. The analog integrator 632 generates an integral signal by integrating the difference signal. The analog integrator 632 outputs the integral signal to the ADC 633. In addition, the analog integrator 632 outputs the integral signal as the above residual signal to the third analog-to-digital conversion unit 660 upon completion of analog-to-digital conversion by the second analog-to-digital conversion unit 630.

The ADC 633 receives a selected reference voltage group from the multiplexer 210, and the integral signal from the analog integrator 632. The ADC 633 generates a digital signal by performing analog-to-digital conversion of the integral signal by using the selected reference voltage group. The ADC 633 outputs the digital signal to the digital integrator 634 and the DAC 635. Note that the ADC 633 may be referred to as the internal ADC 633 to be discriminated from the ADC in FIG. 13.

The digital integrator 634 receives the digital signal from the ADC 633. The digital integrator 634 generates an integral signal by integrating the digital signal. The digital integrator 634 outputs the integral signal as an upper-bit digital signal to the multiplexer 620 upon completion of analog-to-digital conversion by the second analog-to-digital conversion unit 630.

The DAC 635 receives the selected reference voltage group from the multiplexer 210, and the digital signal from the ADC 633. The DAC 635 generates a feedback signal in the next cycle by performing digital-to-analog conversion of the digital signal by using the selected reference voltage group. The DAC 635 outputs the feedback signal to the subtractor 631. As the voltage range of a selected reference voltage group used by the DAC 635 becomes narrower, the time required for the settling of an input signal in the analog integrator 632 becomes shorter. That is, using a proper selected reference voltage group can increase the operating frequency of the second analog-to-digital conversion unit 630, and hence implement high-speed analog-to-digital conversion.

The third analog-to-digital conversion unit 660 corresponds to an ADC (e.g., a Nyquist ADC) of a type different from that of a multisampling ADC. The Nyquist ADC can perform analog-to-digital conversion with a sampling count smaller than that for the multisampling ADC. The third analog-to-digital conversion unit 660 receives a residual signal from the second analog-to-digital conversion unit 630. The third analog-to-digital conversion unit 660 generates a lower-bit digital signal by performing analog-to-digital conversion of the residual signal. The third analog-to-digital conversion unit 660 outputs the lower-bit digital signal to the multiplexer 620.

More specifically, as exemplified by FIG. 14, the operation of the ADC in FIG. 13 corresponds to a repetition of a series of processes, including analog-to-digital conversion by the first analog-to-digital conversion unit 100, analog-to-digital conversion by the second analog-to-digital conversion unit 630, and analog-to-digital conversion by the third analog-to-digital conversion unit 660. In this case, the first analog-to-digital conversion unit 100 starts analog-to-digital conversion before the complete settling of an analog signal. The second analog-to-digital conversion unit 630 performs analog-to-digital conversion by using a selected reference voltage group in a voltage range narrower than the full scale. The third analog-to-digital conversion unit 660 performs analog-to-digital conversion of a residual signal corresponding to an analog-to-digital conversion residue in the second analog-to-digital conversion unit 630 at high speed. Therefore, the ADC in FIG. 13 can perform high-resolution analog-to-digital conversion at high speed.

As described above, the ADC according to the sixth embodiment includes a first analog-to-digital conversion unit for upper bits, a second analog-to-digital conversion unit for intermediate bits, and a third analog-to-digital conversion unit for lower bits. The first analog-to-digital conversion unit generates an upper-bit digital signal by roughly performing analog-to-digital conversion of the analog signal before the complete settling of an analog signal. In addition, a selected reference voltage group in a voltage range narrower than the full scale is obtained based on this upper-bit digital signal. This selected reference voltage group can increase the operating frequency which can be used by the second analog-to-digital conversion unit. The second analog-to-digital conversion unit generates an intermediate-bit digital signal by finely performing analog-to-digital conversion of the analog signal by using the above selected reference voltage group after the complete settling of the analog signal. The third analog-to-digital conversion unit then generates a lower-bit digital signal by performing analog-to-digital conversion of a residual signal corresponding to an analog-to-digital conversion residue in the second analog-to-digital conversion unit at high speed. Therefore, this ADC can perform high-resolution analog-to-digital conversion at high speed.

(Seventh Embodiment)

Figure 15:
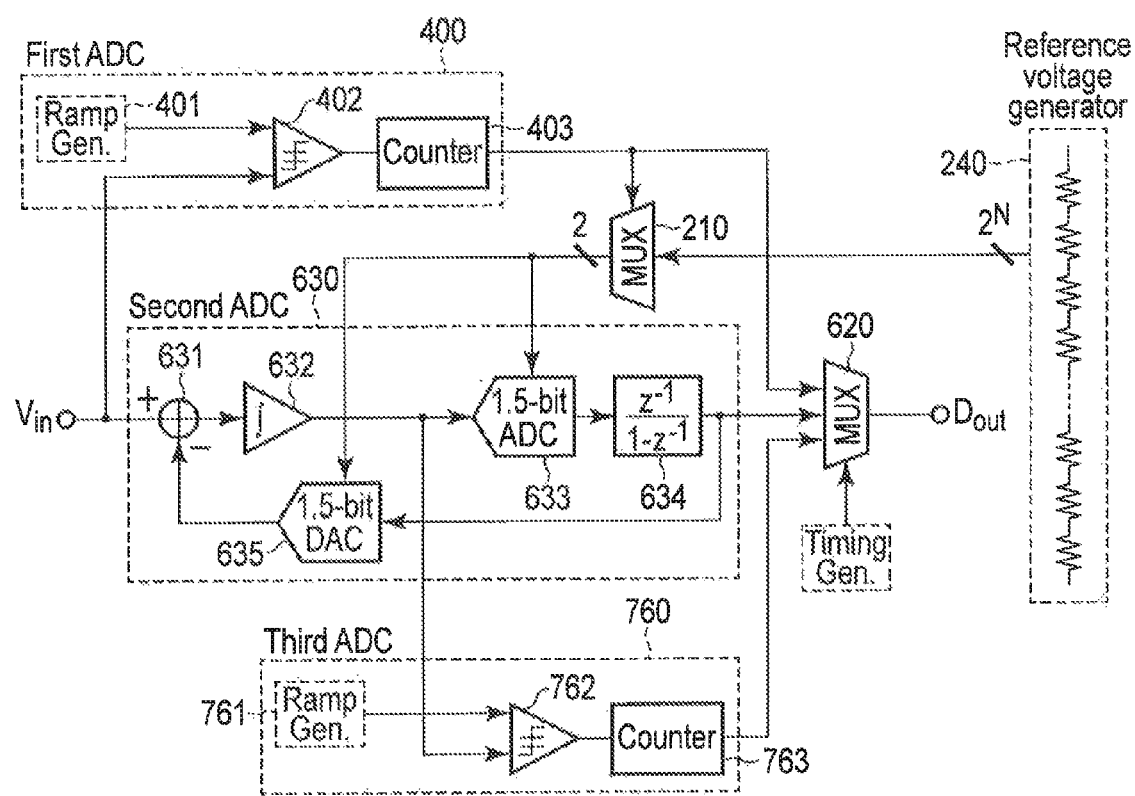
FIG. 15 is a block diagram exemplifying an ADC according to the seventh embodiment.

As exemplified by FIG. 15, an ADC according to the seventh embodiment includes a first analog-to-digital conversion unit 400, a multiplexer 210, a multiplexer 620, a second analog-to-digital conversion unit 630, a reference voltage generator 240, and a third analog-to-digital conversion unit 760. The ADC in FIG. 15 generates a digital signal $D_{out}$ including an upper-bit digital signal, an intermediate-bit digital signal, and a lower-bit digital signal by performing analog-to-digital conversion of an analog signal $V_{in}$.

The first analog-to-digital conversion unit 400 in FIG. 15 differs from the first analog-to-digital conversion unit 400 in FIG. 9 in that it outputs an upper-bit digital signal to the multiplexer 620 instead of the multiplexer 120. The multiplexer 210 in FIG. 15 differs from the multiplexer 210 in FIG. 9 in that it outputs a selected reference voltage group to the second analog-to-digital conversion unit 630 instead of the second analog-to-digital conversion unit 230.

The multiplexer 620 in FIG. 15 differs from the multiplexer 620 in FIG. 13 in that it receives a lower-bit digital signal from the third analog-to-digital conversion unit 760 instead of the third analog-to-digital conversion unit 660. The second analog-to-digital conversion unit 630 in FIG. 15 differs from the second analog-to-digital conversion unit 630 in FIG. 13 in that it outputs a residual signal to the third analog-to-digital conversion unit 760 instead of the third analog-to-digital conversion unit 660.

The third analog-to-digital conversion unit 760 corresponds to a single-slope ADC. The third analog-to-digital conversion unit 760 receives the residual signal from the second analog-to-digital conversion unit 630. The third analog-to-digital conversion unit 760 generates a lower-bit digital signal by performing analog-to-digital conversion of the residual signal. The third analog-to-digital conversion unit 760 outputs the lower-bit digital signal to the multiplexer 620.

More specifically, the third analog-to-digital conversion unit 760 includes a ramp wave generator 761, a comparator 762, and a counter 763.

The ramp wave generator 761 generates a ramp wave over an operation period of the third analog-to-digital conversion unit 760. The ramp wave generator 761 outputs the ramp wave to the first input terminal of the comparator 762.

The comparator 762 includes first and second input terminals. The comparator 762 receives the ramp wave from the ramp wave generator 761 via the first input terminal, and a residual signal from the second analog-to-digital conversion unit 630 via the second input terminal. The comparator 762 outputs the comparison result signal obtained from the ramp wave and the residual signal in synchronism with a clock signal (not shown) to the counter 763. For example, the comparator 762 may output a comparison result signal of "1" if the voltage of the residual signal is equal to or more than that of the ramp wave, and a comparison result signal of "0" otherwise.

The counter 763 receives the comparison result signal from the comparator 762. The counter 763 counts the comparison result signal. The time (the number of clocks) taken to invert the comparison result signal (i.e., to raise the voltage of the ramp wave to a voltage higher than that of the residual signal) is proportional to the voltage of the residual signal. Therefore, the count value of the comparison result signal corresponds to the analog-to-digital conversion result of the residual signal. The counter 763 outputs the count value as a lower-bit digital signal to the multiplexer 620.

As described above, the ADC according to the seventh embodiment respectively uses single-slope ADCs as the first analog-to-digital conversion unit and the third analog-to-digital conversion unit described in the sixth embodiment described above. Therefore, this ADC can obtain the same or similar effects to those of the sixth embodiment. In addition, it is possible to implement both the first analog-to-digital conversion unit and the third analog-to-digital conversion unit with small areas and low power consumption.

(Eighth Embodiment)

As exemplified by FIG. 16, an ADC according to the eighth embodiment includes a first analog-to-digital conversion unit 500, a multiplexer 210, a multiplexer 620, a second analogto-digital conversion unit 630, a reference voltage generator 240, and a third analog-to-digital conversion unit 860. The ADC in FIG. 16 generates a digital signal including an upper-bit digital signal, an intermediate-bit digital signal, and a lower-bit digital signal by performing analog-to-digital conversion of an analog signal.

The first analog-to-digital conversion unit 500 in FIG. 16 differs from the first analog-to-digital conversion unit 500 in FIG. 10 in that it outputs the upper-bit digital signal to the multiplexer 620 instead of the multiplexer 120. The multiplexer 210 in FIG. 16 differs from the multiplexer 210 in FIG. 10 in that it outputs a selected reference voltage group to the second analog-to-digital conversion unit 630 instead of the second analog-to-digital conversion unit 230.

The multiplexer 620 in FIG. 16 differs from the multiplexer 620 in FIG. 13 in that it receives the lower-bit digital signal from the third analog-to-digital conversion unit 860 instead of the third analog-to-digital conversion unit 660. The second analog-to-digital conversion unit 630 in FIG. 16 differs from the second analog-to-digital conversion unit 630 in FIG. 13 in that it outputs a residual signal to the third analog-to-digital conversion unit 860 instead of the third analog-to-digital conversion unit 660.

The third analog-to-digital conversion unit 860 corresponds to a cyclic ADC. The third analog-to-digital conversion unit 860 receives the residual signal from the second analog-to-digital conversion unit 630. The third analog-to-digital conversion unit 860 generates a lower-bit digital signal by performing analog-to-digital conversion of the residual signal. The third analog-to-digital conversion unit 860 outputs the lower-bit digital signal to the multiplexer 620.

More specifically, the third analog-to-digital conversion unit 860 includes a selector 861, an ADC 862, a DAC 863, a subtractor 864, and an amplifier 865.

The selector 861 includes first and second terminals. The selector 861 receives the residual signal from the second analog-to-digital conversion unit 630 via the first input terminal, and a feedback signal from the amplifier 865 via the second input terminal. The selector 861 obtains a selection signal by selecting one of these two input signals. More specifically, the selector 861 selects the residual signal in the first cycle, and the feedback signal in the second or later cycles. The selector 861 outputs the selection signal to the ADC 862. When the third analog-to-digital conversion unit 860 also needs to operate in the next cycle, the selector 861 also needs to output the selection signal to the subtractor 864.

The ADC 862 receives the selection signal from the selector 861. The ADC 862 generates a digital signal by performing analog-to-digital conversion of the selection signal. The ADC 862 outputs the digital signal to the multiplexer 620. This digital signal corresponds to a 1-bit digital signal of the lower-bit digital signal. If the third analog-to-digital conversion unit 860 also operates in the next cycle, the ADC 862 also needs to output the digital signal to the DAC 863. Note that the ADC 862 may be referred to as the internal ADC 862 to be discriminated from the ADC in FIG. 16.

The DAC 863 receives the digital signal from the ADC 862. The DAC 863 generates an analog signal by performing digital-to-analog conversion of the digital signal. The DAC 863 outputs the analog signal to the subtractor 864.

The subtractor 864 receives the selection signal from the selector 861, and the analog signal from the DAC 863. The subtractor 864 generates a residual signal corresponding to an analog-to-digital conversion residue in the ADC 862 by subtracting the analog signal from the selection signal. The subtractor 864 outputs the residual signal to the amplifier 865.

The amplifier 865 receives the residual signal from the subtractor 864. The amplifier 865 generates a feedback signal by amplifying the residual signal twice. The amplifier 865 outputs the feedback signal to the second input terminal of the selector 861.

That is, the third analog-to-digital conversion unit 860 generates an MSB digital signal of the lower-bit digital signal by comparing the voltage of the residual signal with a reference voltage in the first cycle. In addition, the third analog-to-digital conversion unit 860 generates an SSB digital signal of the lower-bit digital signal by comparing the above reference voltage with the voltage obtained by doubling the voltage of the residual signal, generated in the first cycle, in the second cycle. Likewise, the third analog-to-digital conversion unit 860 generates an LSB digital signal of the lower-bit digital signal by comparing the above reference voltage with the voltage obtained by doubling the voltage of the residual signal, generated in the (N−1)th cycle, in the Nth cycle.

Note that the ADC 862 includes the same or similar elements to those of the ADC 633, depending on the implementation. Therefore, the ABC 862 and the ADC 633 can be shared by time division. The same applies to the DAC 863 and the DAC 635. In addition, the amplifier 865 includes the same or similar elements to those of the analog integrator 632, depending on the implementation. Therefore, the amplifier 865 and the analog integrator 632 can also be shared by time division. It is possible to suppress the area of the ABC in FIG. 16 by time-divisionally sharing many elements between the third analog-to-digital conversion unit 860 and the second analog-to-digital conversion unit 630.

As described above, the ADC according to the eighth embodiment uses cyclic ADCs as the first analog-to-digital conversion unit and the third analog-to-digital conversion unit described in the sixth embodiment described above. Therefore, this ADC can obtain the same or similar effects to those of the first embodiment. In addition, it is possible to implement both the first analog-to-digital conversion unit and the third analog-to-digital conversion unit with small areas and make it operate at high speed.

(Ninth Embodiment)

As exemplified by FIG. 17, an ADC according to the ninth embodiment includes a first analog-to-digital conversion unit 400, a multiplexer 210, a second analog-to-digital conversion unit 630, a reference voltage generator 240, a sampler 950, a third analog-to-digital conversion unit 760, and an amplifier 970. Note that the amplifier 970 may be omitted. The ADC in FIG. 17 generates a digital signal $D_{out}$ including an upper-bit digital signal, an intermediate-bit digital signal, and a lower-bit digital signal by performing analog-to-digital conversion of an analog signal $V_{in}$.

The second analog-to-digital conversion unit 630 in FIG. 17 differs from the second analog-to-digital conversion unit 630 in FIG. 15 in that it outputs a residual signal to the amplifier 970 instead of the third analog-to-digital conversion unit 760. The third analog-to-digital conversion unit 760 in FIG. 17 differs from the third analog-to-digital conversion unit 760 in FIG. 15 in that it receives a sampled signal from the sampler 950 instead of a residual signal from the second analog-to-digital conversion unit 630.

The amplifier 970 receives a residual signal from the second analog-to-digital conversion unit 630. The amplifier 970 generates an amplified residual signal by amplifying the residual signal M times. The amplifier 970 outputs the amplified residual signal to the sampler 950.

In this case, amplifying the residual signal M (>1) times reduces the influence of noise (e.g., thermal noise or distortion) generated in the third analog-to-digital conversion unit 760 to 1/M in input terms. That is, the accuracy requirement of the third analog-to-digital conversion unit 760 is alleviated as compared with a case in which the above amplification is not performed.

The sampler 950 receives the amplified residual signal from the amplifier 970. The sampler 950 obtains a sampled signal by sampling the amplified residual signal. The sampler 950 may be, for example, a sample/hold circuit. The sampler 950 outputs the sampled signal to the third analog-to-digital conversion unit 760.

In this case, the ADC in FIG. 17 can start settling an analog signal next to the current analog signal after sampling of a residual signal. That is, this ADC can concurrently perform (i.e., by pipeline processing) analog-to-digital conversion by the third analog-to-digital conversion unit 760 and the settling of an analog signal next to the current analog signal (and succeeding analog-to-digital conversion by the first analog-to-digital conversion unit 400).

As described above, the ADC according to the ninth embodiment includes, between the second analog-to-digital conversion unit and the third analog-to-digital conversion described in the seventh embodiment, the sampler which samples a residual signal corresponding to an analog-to-digital conversion residue in the second analog-to-digital conversion unit. This ADC can concurrently perform analog-to-digital conversion by the third analog-to-digital conversion unit and settling of the next analog signal (and succeeding analog-to-digital conversion by the first analog-to-digital conversion unit). This ADC can therefore obtain the same or similar effects to those of the seventh embodiment, and perform analog-to-digital conversion at higher speed. In addition, the ADC includes the amplifier between the second analog-to-digital conversion unit and the sampler. Therefore, according to the ADC, the accuracy requirement on the third analog-to-digital conversion unit is alleviated, and hence it is possible to simplify the third analog-to-digital conversion unit.

Note that in the ADC in FIG. 17, the first analog-to-digital conversion unit 400 may be replaced with the first analog-to-digital conversion unit 100 in FIG. 13 or the first analog-to-digital conversion unit 500 in FIG. 16. Likewise, in the ADC in FIG. 17, the third analog-to-digital conversion unit 760 may be replaced with the third analog-to-digital conversion unit 660 in FIG. 13 or the third analog-to-digital conversion unit 860 in FIG. 16.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An analog-to-digital converter comprising:
a first analog-to-digital conversion unit configured to perform analog-to-digital conversion of an analog signal in a first period to generate an upper-bit digital signal;
a selector configured to select not less than one reference voltage based on the upper-bit digital signal to obtain a selected reference voltage group in a voltage range narrower than a full scale; and
a second analog-to-digital conversion unit configured to perform analog-to-digital conversion of the analog signal by using the selected reference voltage group to generate a lower-bit digital signal,
wherein the first period starts before settling of the analog signal up to an accuracy corresponding to a total resolution of the first analog-to-digital conversion unit and the second analog-to-digital conversion unit.

2. The converter according to claim 1, wherein the selector selects a plurality of reference voltages based on the upper-bit digital signal to obtain the selected reference voltage group.

3. The converter according to claim 2, wherein the selector selects a second reference voltage lower than a first reference voltage corresponding to the upper-bit digital signal by a (a is an integer) steps and a third reference voltage higher than the first reference voltage by b (b is an integer) steps to obtain the selected reference voltage group.

4. An analog-to-digital converter comprising:
a first analog-to-digital conversion unit configured to perform analog-to-digital conversion of an analog signal in a first period to generate an upper-bit digital signal;
a selector configured to select not less than one reference voltage based on the upper-bit digital signal to obtain a selected reference voltage group in a voltage range narrower than a full scale;
a second analog-to-digital conversion unit configured to perform analog-to-digital conversion of the analog signal by using the selected reference voltage group to generate an intermediate-bit digital signal; and
a third analog-to-digital conversion unit configured to generate a lower-bit digital signal by performing analog-to-digital conversion of a residual signal corresponding to an analog-to-digital conversion residue in the second analog-to-digital conversion unit,
wherein the first period starts before settling of the analog signal up to an accuracy corresponding to a total resolution of the first analog-to-digital conversion unit, the second analog-to-digital conversion unit, and the third analog-to-digital conversion unit.

5. An analog-to-digital conversion method comprising:
performing, by a first analog-to-digital conversion unit, analog-to-digital conversion of an analog signal in a first period to generate an upper-bit digital signal;
selecting, by a selector, not less than one reference voltage based on the upper-bit digital signal to obtain a selected reference voltage group in a voltage range narrower than a full scale; and
performing, by a second analog-to-digital conversion unit, analog-to-digital conversion of the analog signal by using the selected reference voltage group to generate a lower-bit digital signal,
wherein the first period starts before settling of the analog signal up to an accuracy corresponding to a total resolution of the first analog-to-digital conversion unit and the second analog-to-digital conversion unit.

6. An analog-to-digital conversion method comprising:
performing, by a first analog-to-digital conversion unit, analog-to-digital conversion of an analog signal in a first period to generate an upper-bit digital signal;
selecting, by a selector, not less than one reference voltage based on the upper-bit digital signal to obtain a selected reference voltage group in a voltage range narrower than a full scale;
performing, by a second analog-to-digital conversion unit, analog-to-digital conversion of the analog signal by using the selected reference voltage group to generate an intermediate-bit digital signal; and
performing, by a third analog-to-digital conversion unit, analog-to-digital conversion of a residual signal to generate a lower-bit digital signal, the residual signal corresponding to an analog-to-digital conversion residue in the second analog-to-digital conversion unit, wherein the first period starts before settling of the analog signal up to an accuracy corresponding to a total resolution of the first analog-to-digital conversion unit, the second analog-to-digital conversion unit, and the third analog-to-digital conversion unit.

* * * * *